(12) United States Patent
Park et al.

(10) Patent No.: US 10,892,410 B2
(45) Date of Patent: Jan. 12, 2021

(54) VARIABLE RESISTANCE MEMORY DEVICES AND METHODS OF MANUFACTURING VARIABLE RESISTANCE MEMORY DEVICES

(71) Applicant: Samsung Electronics Co., Ltd., Suwon-si (KR)

(72) Inventors: Jeonghee Park, Hwaseong-si (KR); Jiho Park, Suwon-si (KR); Changyup Park, Hwaseong-si (KR); Dongho Ahn, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/459,637

(22) Filed: Jul. 2, 2019

(65) Prior Publication Data

US 2020/0075850 A1 Mar. 5, 2020

(30) Foreign Application Priority Data

Aug. 29, 2018 (KR) ........................ 10-2018-0101800

(51) Int. Cl.
*H01L 45/00* (2006.01)
*H01L 27/24* (2006.01)

(52) U.S. Cl.
CPC ...... *H01L 45/1233* (2013.01); *H01L 27/2409* (2013.01); *H01L 27/2481* (2013.01); *H01L 45/06* (2013.01); *H01L 45/141* (2013.01)

(58) Field of Classification Search
CPC ............ H01L 45/1233; H01L 27/2409; H01L 27/2481; H01L 45/06; H01L 45/141; H01L 45/14–149; H01L 45/1273–144; H01L 27/24–249; G11C 2213/11–19; G11C 2213/30–35
See application file for complete search history.

(56) References Cited

U.S. PATENT DOCUMENTS

| | | | |
|---|---|---|---|
| 7,696,077 B2 | 4/2010 | Liu | |
| 8,343,798 B2 | 1/2013 | Choi et al. | |
| 8,664,633 B2 | 3/2014 | Park et al. | |
| 8,865,558 B2 | 10/2014 | Park et al. | |
| 9,227,456 B2 * | 1/2016 | Chien | B42D 15/02 |
| 9,444,046 B2 | 9/2016 | Pio | |
| 9,728,584 B2 | 8/2017 | Ramaswamy et al. | |
| 2015/0325628 A1 | 11/2015 | Nonoguchi et al. | |
| 2016/0027845 A1 * | 1/2016 | Seong | H01L 27/2463 257/5 |
| 2017/0040338 A1 * | 2/2017 | Lee | H01L 27/11582 |
| 2017/0062330 A1 * | 3/2017 | Kim | H01L 23/5226 |
| 2017/0104154 A1 | 4/2017 | Kim et al. | |
| 2018/0047747 A1 | 2/2018 | Tang et al. | |
| 2018/0047787 A1 | 2/2018 | Nakamura et al. | |
| 2019/0115391 A1 * | 4/2019 | Nardi | H01L 45/144 |

FOREIGN PATENT DOCUMENTS

KR 101490053 2/2015

* cited by examiner

*Primary Examiner* — Shahed Ahmed
(74) *Attorney, Agent, or Firm* — Myers Bigel, P.A,

(57) ABSTRACT

A variable resistance memory device may include insulating layers stacked on a substrate, a first conductive line penetrating the insulating layers, switching patterns between the insulating layers, a phase change pattern between the first conductive line and each of the switching patterns, and a capping pattern disposed between the phase change pattern and the first conductive line and disposed in a region surrounded by the phase change pattern.

20 Claims, 16 Drawing Sheets

VARIABLE RESISTANCE MEMORY DEVICES AND METHODS OF MANUFACTURING VARIABLE RESISTANCE MEMORY DEVICES

CROSS-REFERENCE TO RELATED APPLICATION

This U.S. non-provisional patent application claims priority under 35 U.S.C. § 119 to Korean Patent Application No. 10-2018-0101800, filed on Aug. 29, 2018, in the Korean Intellectual Property Office, the disclosure of which is hereby incorporated by reference in its entirety.

TECHNICAL FIELD

Aspects of the present disclosure relate to a variable resistance memory device and, more particularly, to a vertical stack type variable resistance memory device.

BACKGROUND

Semiconductor devices have been increasingly integrated to provide improved performance characteristics and lower manufacture costs. As the integration density of semiconductor devices affects the costs of the semiconductor devices, there is a demand for more highly integrated semiconductor devices. The integration density of typical two-dimensional (2D) or planar semiconductor devices may be mainly determined by an area occupied by a unit memory cell. The integration density of the typical 2D or planar semiconductor devices may be greatly affected by a technique of forming fine patterns, as forming finer patterns correlates with a reduction in the area occupied by the unit memory cell. However, since extremely high-priced apparatuses are needed to form fine patterns, the integration density of 2D semiconductor devices continues to increase but is still limited. Three-dimensional (3D) semiconductor devices including three-dimensionally arranged memory cells have been developed to overcome these limitations. In addition, next-generation semiconductor memory devices (e.g., magnetic random access memory (MRAM) devices and phase-change random access memory (PRAM) devices) have been developed to provide higher-performance semiconductor memory devices, including higher-performance semiconductor memory devices having lower power consumption.

SUMMARY

Aspects of the present disclosure may provide a variable resistance memory device with improved reliability.

Aspects of the present disclosure may also provide a variable resistance memory device with improved electrical characteristics.

In some aspects, a variable resistance memory device may include insulating layers stacked on a substrate, a first conductive line penetrating the insulating layers, switching patterns between the insulating layers, a phase change pattern between the first conductive line and each of the switching patterns, and a capping pattern disposed between the phase change pattern and the first conductive line and disposed in a region surrounded by the phase change pattern.

In some aspects, a variable resistance memory device may include insulating layers stacked on a substrate, a first conductive line penetrating the insulating layers, switching patterns between the insulating layers, and a phase change pattern between the first conductive line and each of the switching patterns. The phase change pattern may include first material layers and second material layers, which are alternately stacked on a sidewall of each of the switching patterns.

In some aspects, a variable resistance memory device may include first conductive lines which are parallel to each other on a substrate and are spaced apart from each other in a first direction, a second conductive line which extends in a direction perpendicular to a top surface of the substrate and is disposed between the first conductive lines, and a phase change pattern between each of the first conductive lines and the second conductive line. The phase change pattern may have a region recessed from a sidewall of the phase change pattern which is in contact with the second conductive line.

BRIEF DESCRIPTION OF THE DRAWINGS

The inventive concepts described by the present disclosure will become more apparent in view of the attached drawings and accompanying detailed description.

FIGS. 4A to 9A are plan views illustrating aspects of methods of manufacturing variable resistance memory devices according to the inventive concepts.

FIGS. 4B to 9B are cross-sectional views taken along lines I-I' of FIGS. 4A to 9A, respectively, to illustrate aspects of the methods of manufacturing a variable resistance memory device according to the inventive concepts.

DETAILED DESCRIPTION

Figure 1:
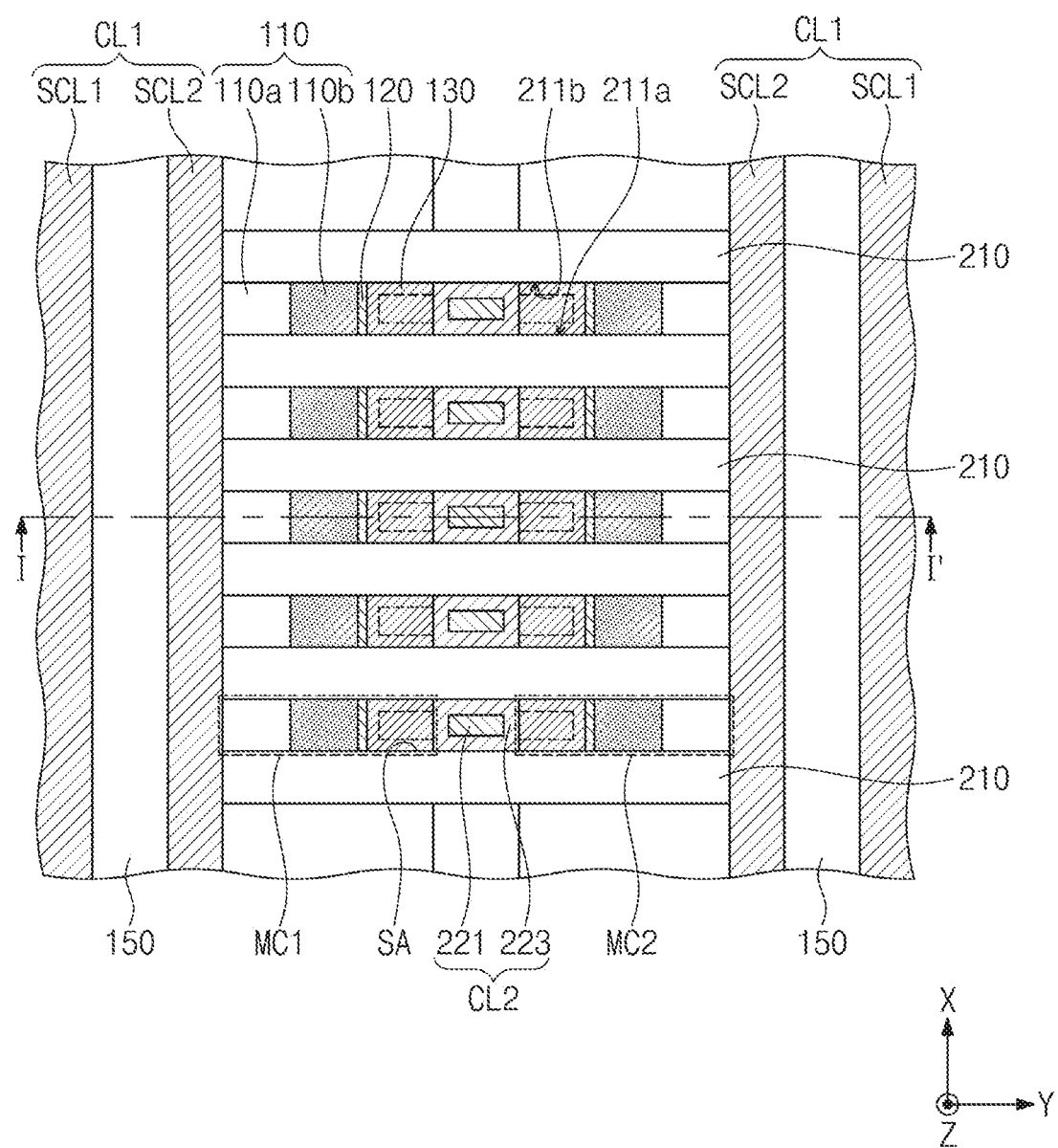
FIG. 1 is a plan view illustrating a variable resistance memory device according to the inventive concepts.
Figure 2:
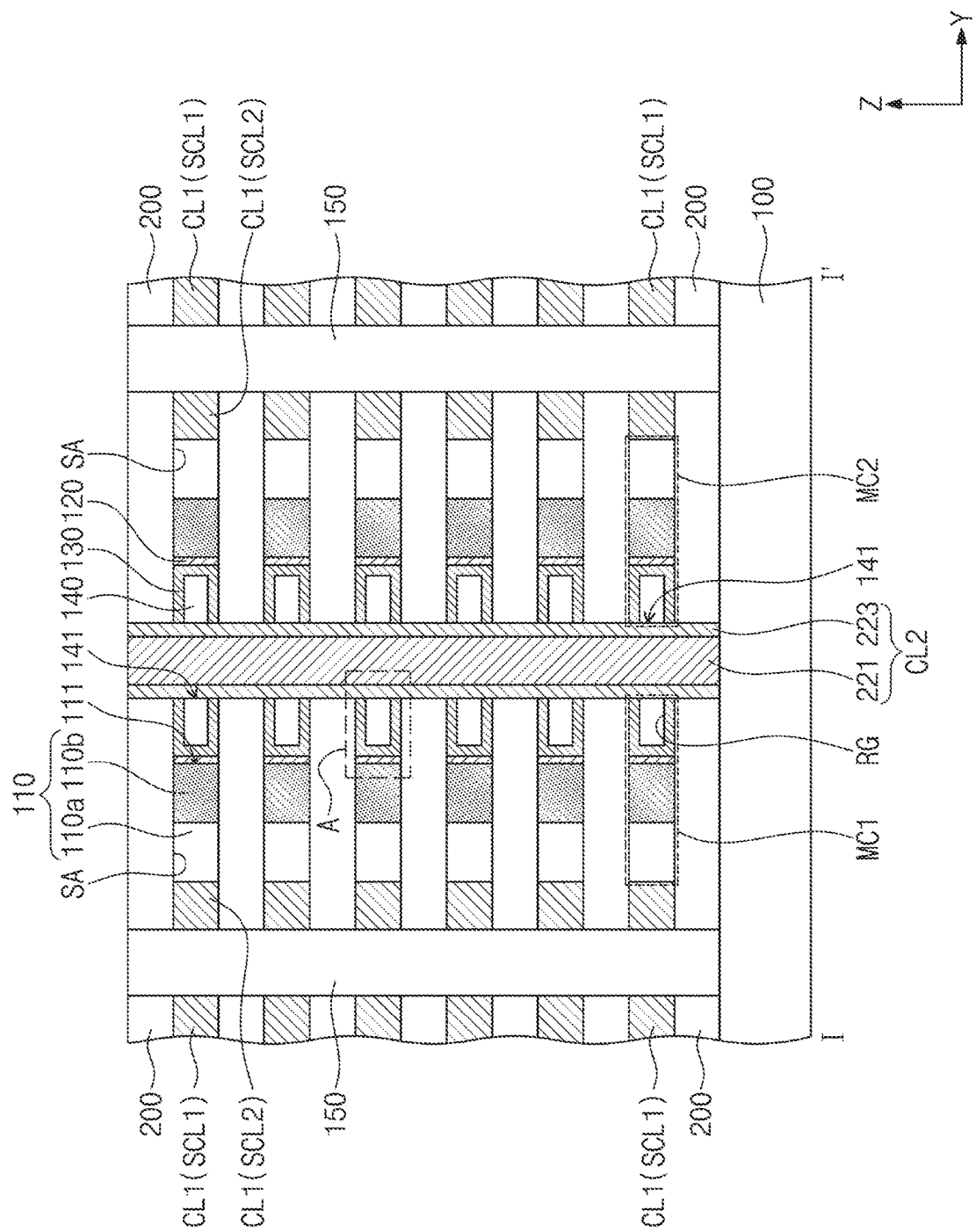
FIG. 2 is a cross-sectional view taken along a line I-I' of FIG. 1 to illustrate aspects of the variable resistance memory device of FIG. 1.
Figure 3A:
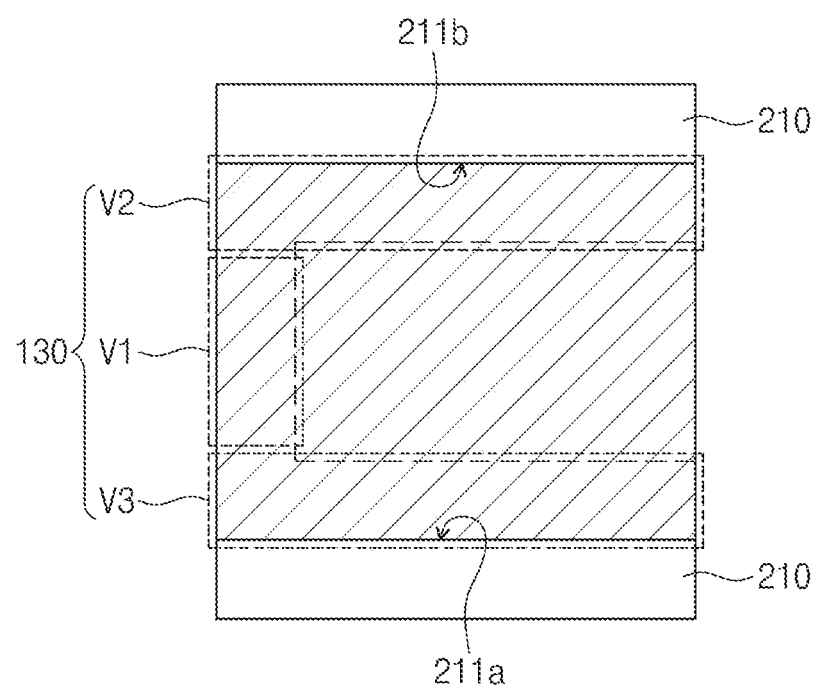
FIG. 3A is an enlarged view of a phase change pattern of FIG. 1.
Figure 3B:
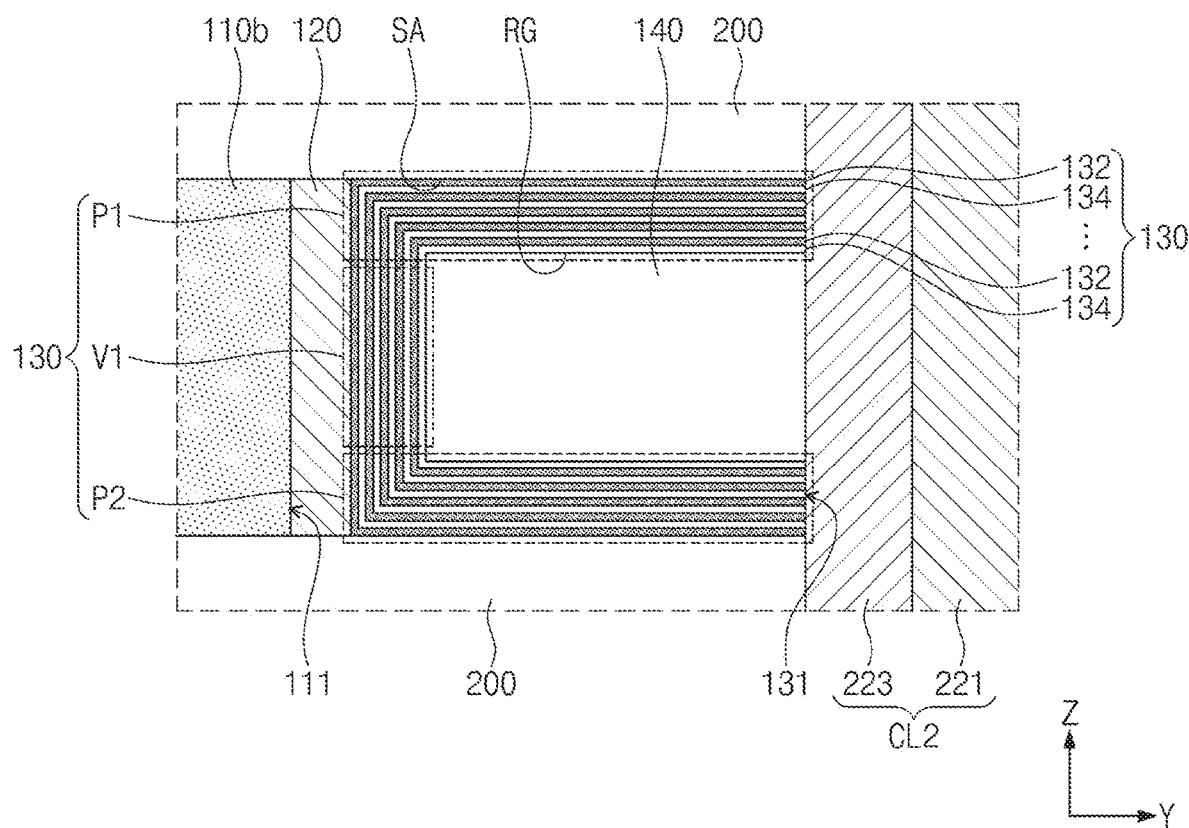
FIG. 3B is an enlarged view of a portion 'A' of FIG. 2.

FIG. 1 is a plan view illustrating a variable resistance memory device according to the inventive concepts. FIG. 2 is a cross-sectional view taken along a line I-I' of FIG. 1 to illustrate aspects of the variable resistance memory device of FIG. 1. FIG. 3A is an enlarged view of a phase change pattern of FIG. 1. FIG. 3B is an enlarged view of a portion 'A' of FIG. 2.

Referring to FIGS. 1 and 2, insulating layers 200 may be sequentially stacked on a substrate 100. For example, the insulating layers 200 may be spaced apart from each other in a third direction Z perpendicular to a top surface of the substrate 100. A lowermost one of the insulating layers 200 may be in contact with the top surface of the substrate 100. Each of the insulating layers 200 may include, for example, a silicon nitride layer. For example, the substrate 100 may be a semiconductor substrate formed of silicon, germanium, or silicon-germanium, or may be a silicon-on-insulator (SOI) substrate or a germanium-on-insulator (GOI) substrate. Filling insulation patterns 210 may be disposed on the substrate 100. The filling insulation patterns 210 may penetrate the insulating layers 200 on the top surface of the substrate 100. For example, the filling insulation patterns 210 may be arranged in a first direction X at equal intervals. Each of the filling insulation patterns 210 may have a long axis in a second direction Y intersecting the first direction X. For example, the filling insulation patterns 210 may include an oxide, a nitride, and/or an oxynitride.

First conductive lines CL1 may be disposed at both sides of the filling insulation patterns 210. For example, the filling insulation patterns 210 may be disposed between a pair of the first conductive lines CL1 when viewed in a plan view. Each of the first conductive lines CL1 may extend in the first direction X between the insulating layers 200 adjacent to each other in the third direction Z. The first conductive lines CL1 may be stacked in the third direction Z, and may be vertically spaced apart from each other with the insulating layers 200 interposed therebetween. The first conductive lines CL1 may be in contact with top and bottom surfaces of the insulating layers 200 and sidewalls of the filling insulation patterns 210. The first conductive lines CL1 may be, for example, word lines. The first conductive lines CL1 may include a metal material (e.g., tungsten, copper, or aluminum).

Second conductive lines CL2 may be disposed between the filling insulation patterns 210. The second conductive lines CL2 may be disposed on the top surface of the substrate 100 and may penetrate the insulating layers 200 disposed between the filling insulation patterns 210. The second conductive lines CL2 may be in contact with the top surface of the substrate 100. The second conductive lines CL2 may be spaced apart from each other and be arranged in the first direction X with the filling insulation patterns 210 interposed therebetween. Each of the second conductive lines CL2 may include a metal pattern 221 and a metal barrier pattern 223. The metal pattern 221 may extend in the third direction Z on the top surface of the substrate 100 and may penetrate the insulating layers 200. The metal barrier pattern 223 may surround a sidewall of the metal pattern 221. The metal pattern 221 may include a metal material (e.g., tungsten). The metal barrier pattern 223 may include a metal nitride (e.g., TiN).

Memory cells MC1 and MC2 may be disposed between the first conductive lines CL1 and the second conductive lines CL2. Each of the memory cells MC1 and MC2 may be disposed between the insulating layers 200 adjacent to each other in the third direction Z. In more detail, each of the memory cells MC1 and MC2 may be disposed in a space SA defined between the filling insulation patterns 210 adjacent to each other in the first direction X and between the insulating layers 200 adjacent to each other in the third direction Z. The memory cells MC1 and MC2 may include first memory cells MC1 and second memory cells MC2. The first memory cells MC1 may be disposed at one side of each of the second conductive lines CL2 (e.g., at a first side of the second conductive lines CL2), and the second memory cells MC2 may be disposed at another side of each of the second conductive lines CL2 (e.g., at a second side of the second conductive lines CL2). The first memory cells MC1 may be spaced apart from the second memory cells MC2 in the second direction Y with the second conductive lines CL2 interposed therebetween. For example, each of the second conductive lines CL2 may be disposed between a pair of the first memory cell MC1 and the second memory cell MC2.

The memory cells MC1 or MC2 arranged in the first direction X may be spaced apart from each other with the filling insulation patterns 210 interposed therebetween, when viewed in a plan view, as seen in FIG. 1. For example, the first memory cells MC1 may be spaced apart from each other in the first direction X with the filling insulation patterns 210 interposed therebetween, and the second memory cells MC2 may be spaced apart from each other in the first direction X with the filling insulation patterns 210 interposed therebetween. The memory cells MC1 may be spaced apart from each other in the third direction Z with the insulating layers 200 interposed therebetween, and the memory cells MC2 may be spaced apart from each other in the third direction Z with the insulating layers 200 interposed therebetween. In some embodiments, a pair of the first memory cell MC1 and the second memory cell MC2 spaced apart from each other in the second direction Y may be connected in common to the second conductive line CL2 disposed therebetween. In some embodiments, the memory cells MC1 or MC2 which are disposed at the same level (that is, the same distance from an upper surface of the substrate 100) and are spaced apart from each other in the first direction X may be connected in common to each of the first conductive lines CL1. For example, the first memory cells MC1 disposed at the same level may be connected in common to one of the first conductive lines CL1, and the second memory cells MC2 disposed at the same level may be connected in common to another of the first conductive lines CL1.

Each of the memory cells MC1 and MC2 may include a switching pattern 110, an electrode 120, a phase change pattern 130, and a capping pattern 140. The switching pattern 110 may be disposed between each of the first conductive lines CL1 and each of the second conductive lines CL2. The switching pattern 110 may be disposed between two insulating layers 200 adjacent to each other in the third direction Z. The switching pattern 110 may be a diode or may be an element based on a threshold switching phenomenon having a nonlinear I-V curve (e.g., a S-shaped I-V curve). For example, the switching pattern 110 may be an ovonic threshold switch (OTS) element having a bi-directional characteristic.

In some embodiments, the switching pattern 110 may be the diode. In this case, the switching pattern 110 may include a first junction pattern 110a and a second junction pattern 110b. The first junction pattern 110a may be adjacent to or closer to each of the first conductive lines CL1, and the second junction pattern 110b may be adjacent to or closer to each of the second conductive lines CL2. The first junction pattern 110a may have a first conductivity type, and the second junction pattern 110b may have a second conductivity type different from the first conductivity type. For example, the first conductivity type may be an N type, and the second conductivity type may be a P type. For example, the second junction pattern 110b may include dopants of the second conductivity type. The first junction pattern 110a may include dopants of the first conductivity type and dopants of the second conductivity type. In this case, a concentration of the first conductivity type dopants may be higher than a concentration of the second conductivity type dopants in the first junction pattern 110a. In some embodiments, the switching pattern 110 may be a silicon diode or oxide diode which has a rectifying property. For example, the switching pattern 110 may be a silicon diode of P-type silicon and N-type silicon or may be an oxide diode of P-type $NiO_x$ and N-type $TiO_x$ or an oxide diode of P-type $CuO_x$ and N-type $TiO_x$.

The electrode 120 may be disposed between the switching pattern 110 and each of the second conductive lines CL2. The electrode 120 may be disposed between the insulating layers 200 adjacent to each other in the third direction Z. The electrode 120 may be in contact with one sidewall 111 of the switching pattern 110. For example, the electrode 120 may be in contact with one sidewall 111 of the second junction pattern 110b. The electrode 120 may include a metal. For example, the electrode 120 may include at least one of W, Ti, Al, Cu, C, CN, TiN, TiAlN, TiSiN, TiCN, WN, CoSiN, WSiN, TaN, TaCN, TaSiN, or TiO. As another example, the electrode 120 may include a metal silicide.

Referring now to FIGS. 3A and 3B, the phase change pattern 130 may be disposed between the electrode 120 and each of the second conductive lines CL2. The phase change pattern 130 may be disposed between the insulating layers 200 adjacent to each other in the third direction Z. The phase change pattern 130 may extend in a direction from a sidewall of the electrode 120 opposite from the one sidewall 111 of the switching pattern 110 toward the second conductive line CL2 along top and bottom surfaces of the insulating layers 200 exposed by each of the spaces SA (e.g., along top and bottom surfaces of the space SA). The phase change pattern 130 may have one sidewall 131 which is in contact with each of the second conductive lines CL2. The phase change pattern 130 may have a region RG laterally recessed from the one sidewall 131 of the phase change pattern 130. The region RG may be at least partially surrounded by the phase change pattern 130.

The phase change pattern 130 may include a first horizontal portion P1, a second horizontal portion P2, a first vertical portion V1, a second vertical portion V2, and a third vertical portion V3. The first horizontal portion P1 may be disposed on the bottom surface of the insulating layer 200 exposed by each of the spaces SA (e.g., on the top surface of the space SA). The second horizontal portion P2 may be disposed on the top surface of the insulating layer 200 exposed by each of the spaces SA (e.g., on the bottom surface of the space SA). The first horizontal portion P1 and the second horizontal portion P2 may be parallel to each other. The first vertical portion V1 may be disposed on the one sidewall 111 of the switching pattern 110, and may be disposed directly on a sidewall of the gate electrode 120 opposite from the one sidewall 111 of the switching pattern 110. The first vertical portion V1 may be disposed between the first horizontal portion P1 and the second horizontal portion P2. The second vertical portion V2 may extend from the second horizontal portion P2 onto a first sidewall 211b of one of two adjacent filling insulation patterns 210 exposed by each of the spaces SA. The second vertical portion V2 may be in contact with the first sidewall 211b of the one of the two adjacent filling insulation patterns 210. The second vertical portion V2 may be connected to the first vertical portion V1, the first horizontal portion P1, and the second horizontal portion P2. The third vertical portion V3 may extend from the second horizontal portion P2 onto a first sidewall 211a of the other of the two adjacent filling insulation patterns 210 exposed by each of the spaces SA. The third vertical portion V3 may be in contact with the first sidewall 211a of the other of the two adjacent filling insulation patterns 210. The first sidewall 211a of the one of the two adjacent filling insulation patterns 210 may be opposite to the first sidewall 211b of the other of the two adjacent filling insulation patterns 210. The third vertical portion V3 may be connected to the first vertical portion V1, the first horizontal portion P1, and the second horizontal portion P2. The second vertical portion V2 and the third vertical portion V3 may be parallel to each other.

The phase change pattern 130 may include a material capable of storing data based on a change in resistance. In some embodiments, the phase change pattern 130 may include a material of which a phase is reversibly changeable between a crystalline state and an amorphous state by temperature. For example, the phase change pattern 130 may include a compound that includes at least one of Te or Se (e.g., chalcogen elements) and at least one of Ge, Sb, Bi, Pb, Sn, Ag, As, S, Si, In, Ti, Ga, P, O, or C. For example, the phase change pattern 130 may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. The phase change pattern 130 may further include impurities. For example, the impurities may include carbon (C), nitrogen (N), or silicon (Si).

The phase change pattern 130 may include a plurality of material layers 132 and 134, as illustrated in FIG. 3B. The plurality of material layers 132 and 134 may include first material layers 132 and second material layers 134. The first material layers 132 and the second material layers 134 may be alternately stacked on the one sidewall 111 of the switching pattern 110 in the second direction Y, and may be alternately stacked directly on a sidewall of the gate electrode 120 that is opposite from the one sidewall 111 of the switching pattern 110. The first material layers 132 and the second material layers 134 may extend onto the top and bottom surfaces of the insulating layers 200 and the first sidewalls 211a and 211b of the two adjacent filling insulation patterns 210, which are exposed by each of the spaces SA. In other words, the first and second material layers 132 and 134 may extend onto the top and bottom surfaces and other sidewalls of the space SA. The first material layers 132 may include a different material from that of the second material layers 134. The first material layers 132 and the second material layers 134 may include phase change materials. For example, the first material layers 132 may include GeTe, InTe, or GeTe, and the second material layers 134 may include $Sb_2Te_3$ or $Bi_2Te_3$.

In some embodiments, the phase change pattern 130 may not include two or more kinds of layers alternately stacked, and may differ from the illustrated example of FIG. 3B. In some embodiments, the phase change pattern 130 may include at least one of a perovskite compound or a conductive metal oxide. The phase change pattern 130 may have a double-layer structure of a conductive metal oxide layer and a tunnel insulating layer or may have a triple-layer structure of a first conductive metal oxide layer, a tunnel insulating layer and a second conductive metal oxide layer. In some cases, the tunnel insulating layer may include aluminum oxide, hafnium oxide, or silicon oxide.

The capping pattern 140 may be disposed in the region RG of the phase change pattern 130. The capping pattern 140 may be disposed between the phase change pattern 130 and each of the second conductive lines CL2. One sidewall 141 of the capping pattern 140, which may be in contact with each of the second conductive lines CL2, may be aligned with a sidewall of each of the second conductive lines CL2 when viewed in a cross-sectional view. The capping pattern 140 may include at least one of silicon oxide or silicon nitride, as examples.

Isolation insulating patterns 150 may extend in the third direction Z on the top surface of the substrate 100. The isolation insulating patterns 150 may be in contact with the top surface of the substrate 100. The isolation insulating patterns 150 may penetrate the first conductive lines CL1 and the insulating layers 200. The isolation insulating patterns 150 may be disposed at both sides of the filling insulation patterns 210 and may extend in the first direction X, when viewed in a plan view. Each of the first conductive lines CL1 may include a first separation conductive line SCL1 and a second separation conductive line SCL2, which are separated from each other by each of the isolation insulating patterns 150.

FIGS. 4A to 9A are plan views illustrating aspects of methods of manufacturing variable resistance memory devices according to the inventive concepts. FIGS. 4B to 9B are cross-sectional views taken along lines I-I' of FIGS. 4A to 9A, respectively, to illustrate aspects of the methods of manufacturing variable resistance memory devices according to the inventive concepts.

Figure 4A:
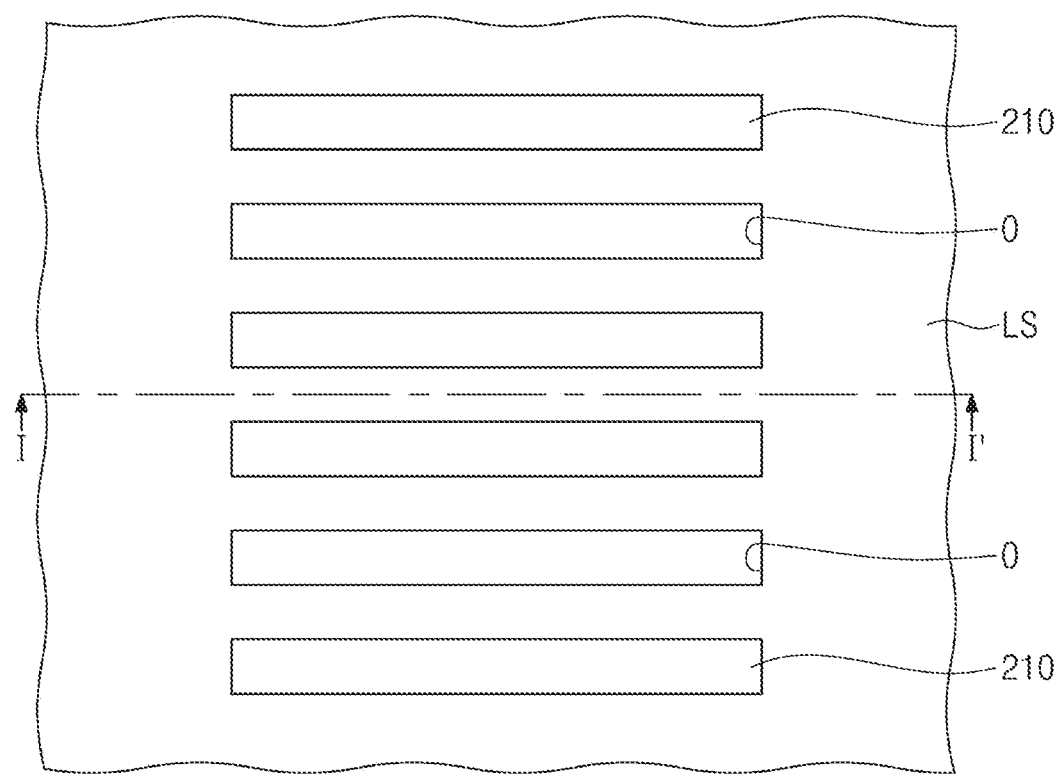
Figure 4A:
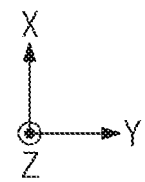
Figure 4B:
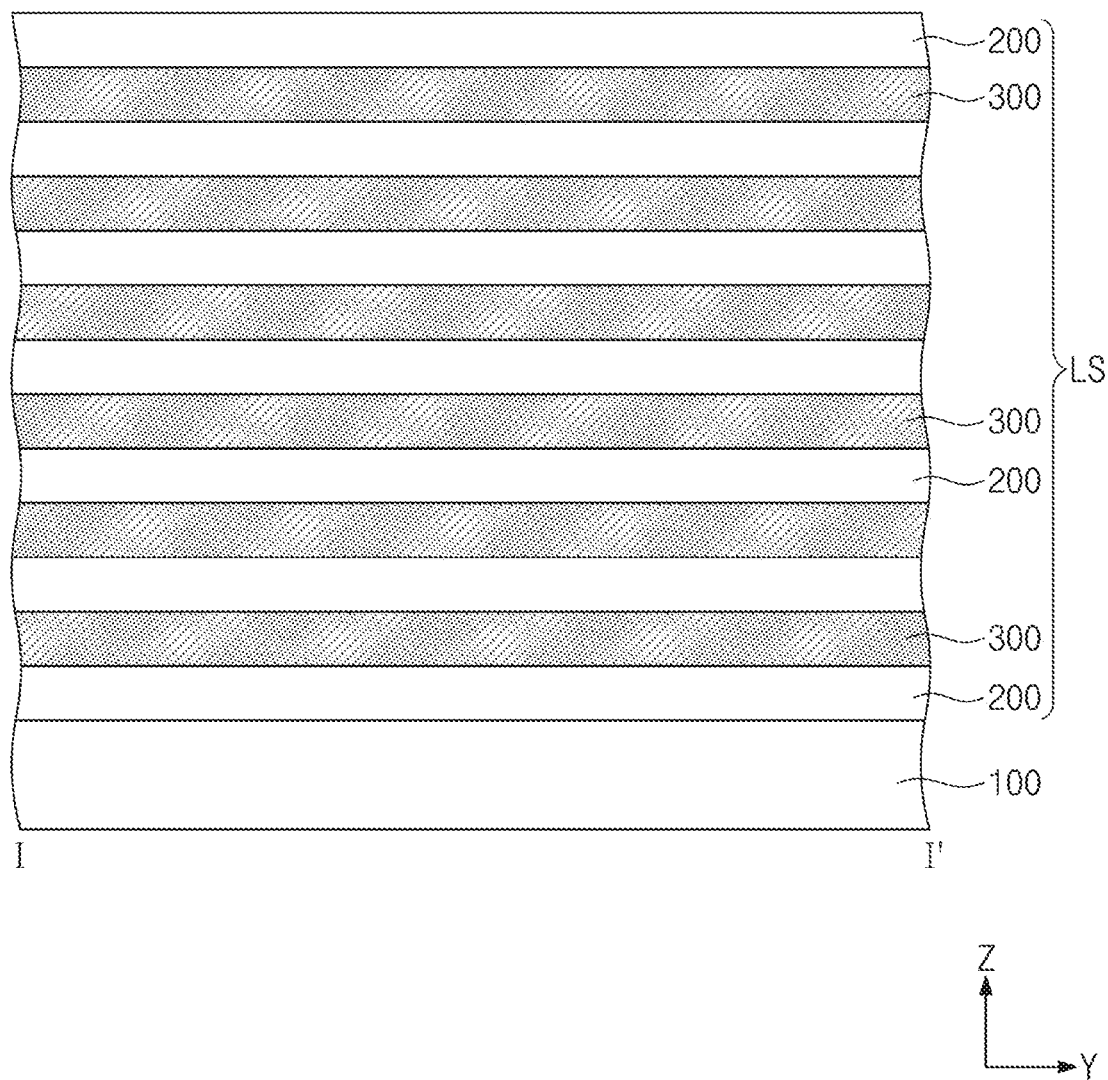

Referring to FIGS. 4A and 4B, a layer structure LS may be formed on a substrate 100. The layer structure LS may include insulating layers 200 and sacrificial layers 300. The insulating layers 200 and the sacrificial layers 300 may be alternately stacked on the substrate 100. A lowermost insulating layer 200 may be a lowermost layer of the layer structure LS, and an uppermost insulating layer 200 may be an uppermost layer of the layer structure LS. Each of the insulating layers 200 may include, for example, a silicon nitride layer. In some embodiments, the sacrificial layers 300 may include a chalcogenide material. In some embodiments, the sacrificial layers 300 may be formed of the same material as the second junction pattern 110b described above. Alternatively, the sacrificial layers 300 may be formed of the same material as the ovonic threshold switch (OTS) element described above. When the sacrificial layers 300 are formed of the same material as the OTS element, a process of forming first junction patterns 110a to be described below may be omitted.

Filling insulation patterns 210 may be formed in the layer structure LS. In some embodiments, the layer structure LS may be patterned to form openings O in the layer structure LS, and an insulating material may be formed to fill the openings O. Subsequently, a planarization process may be performed on the insulating material until a top surface of the layer structure LS is exposed, thereby forming the filling insulation patterns 210. The filling insulation patterns 210 may be spaced apart from each other in a first direction X, and each of the filling insulation patterns 210 may have a long axis in a second direction Y intersecting the first direction X. For example, the filling insulation patterns 210 may include an oxide, a nitride, and/or an oxynitride.

Figure 5A:
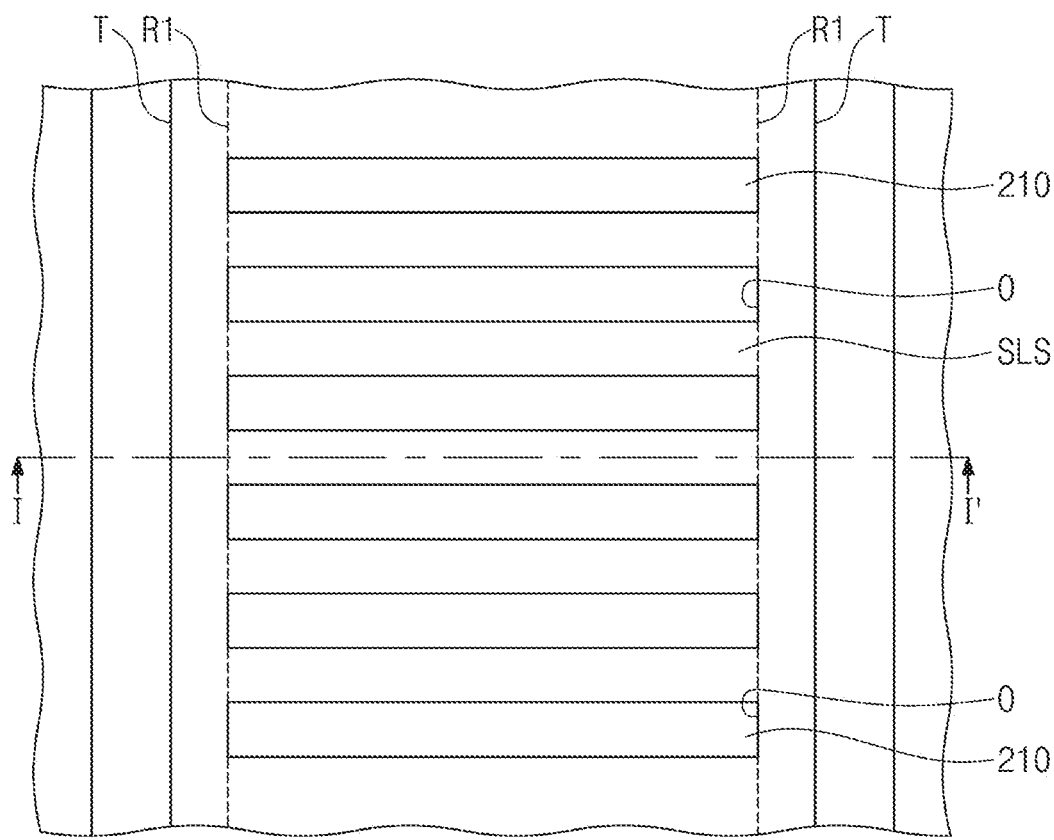
Figure 5B:
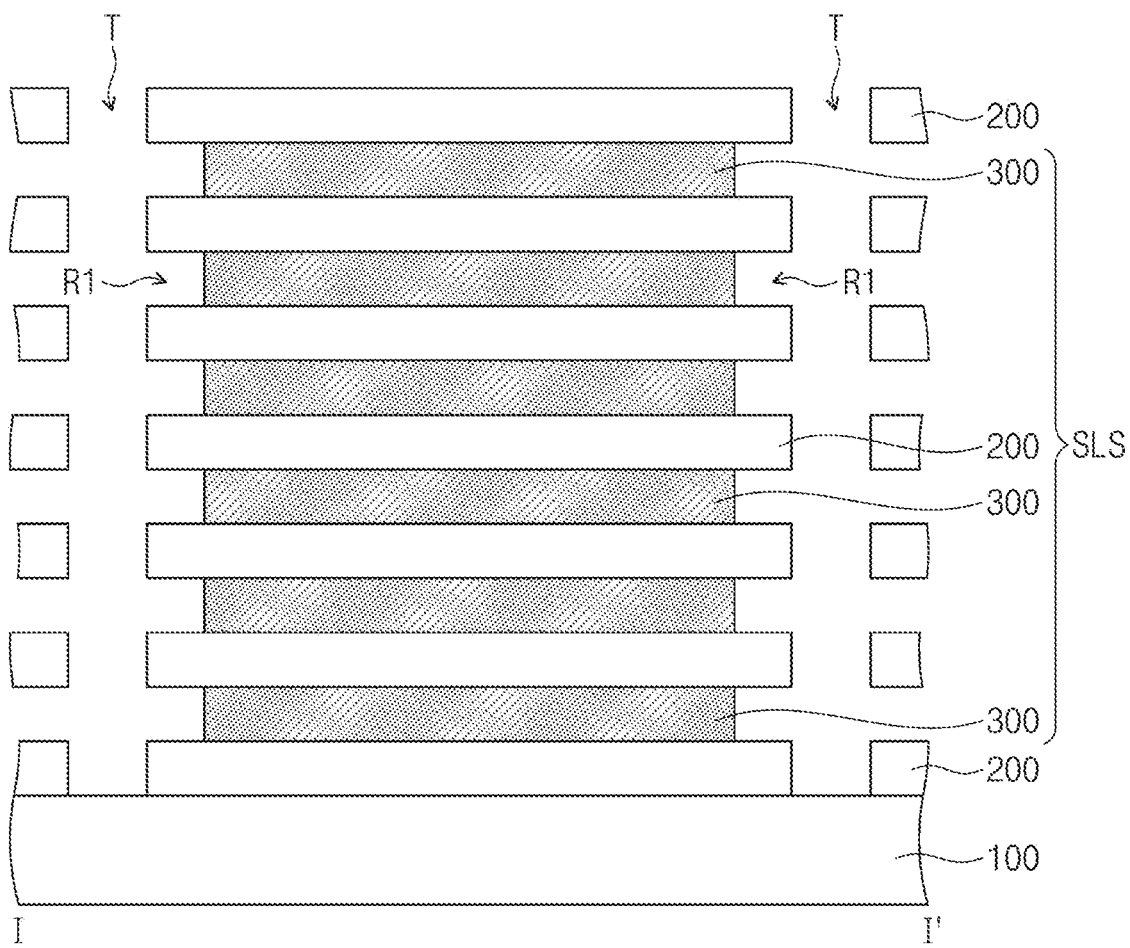

Referring to FIGS. 5A and 5B, trenches T may be formed in the layer structure LS. For example, a mask pattern (not shown) may be formed on the layer structure LS, and the layer structure LS may be etched using the mask pattern as an etch mask to form the trenches T. The trenches T may be formed at both sides of the filling insulation patterns 210 and may extend in the first direction X. In some embodiments, the layer structure LS may be divided into a plurality of layer structures SLS by the formation of the trenches T. The plurality of layer structures SLS may be spaced apart from each other in the second direction Y.

The sacrificial layers 300 exposed by the trenches T may be etched to recess sidewalls of the sacrificial layers 300. Thus, each of first recess regions R1 may be formed between each pair of the insulating layers 200 that are adjacent to each other in a third direction Z perpendicular to the top surface of the substrate 100. Widths of the sacrificial layers 300 in the second direction Y between the trenches T adjacent to each other may be reduced by the formation of the first recess regions R1. For example, the trenches T and the first recess regions R1 may expose sidewalls of the filling insulation patterns 210, which are parallel to the second direction Y. The trenches T and the first recess regions R1 may expose sidewalls of the insulating layers 200, top and bottom surfaces of the insulating layers 200 exposed by the sacrificial layers 300, and sidewalls of the sacrificial layers 300. In some embodiments, due to the formation of the first recess regions R1, each of the layer structures SLS may be disposed between the filling insulation patterns 210 adjacent to each other in the first direction X. The layer structures SLS may be spaced apart from each other in the first direction X.

Figure 6A:
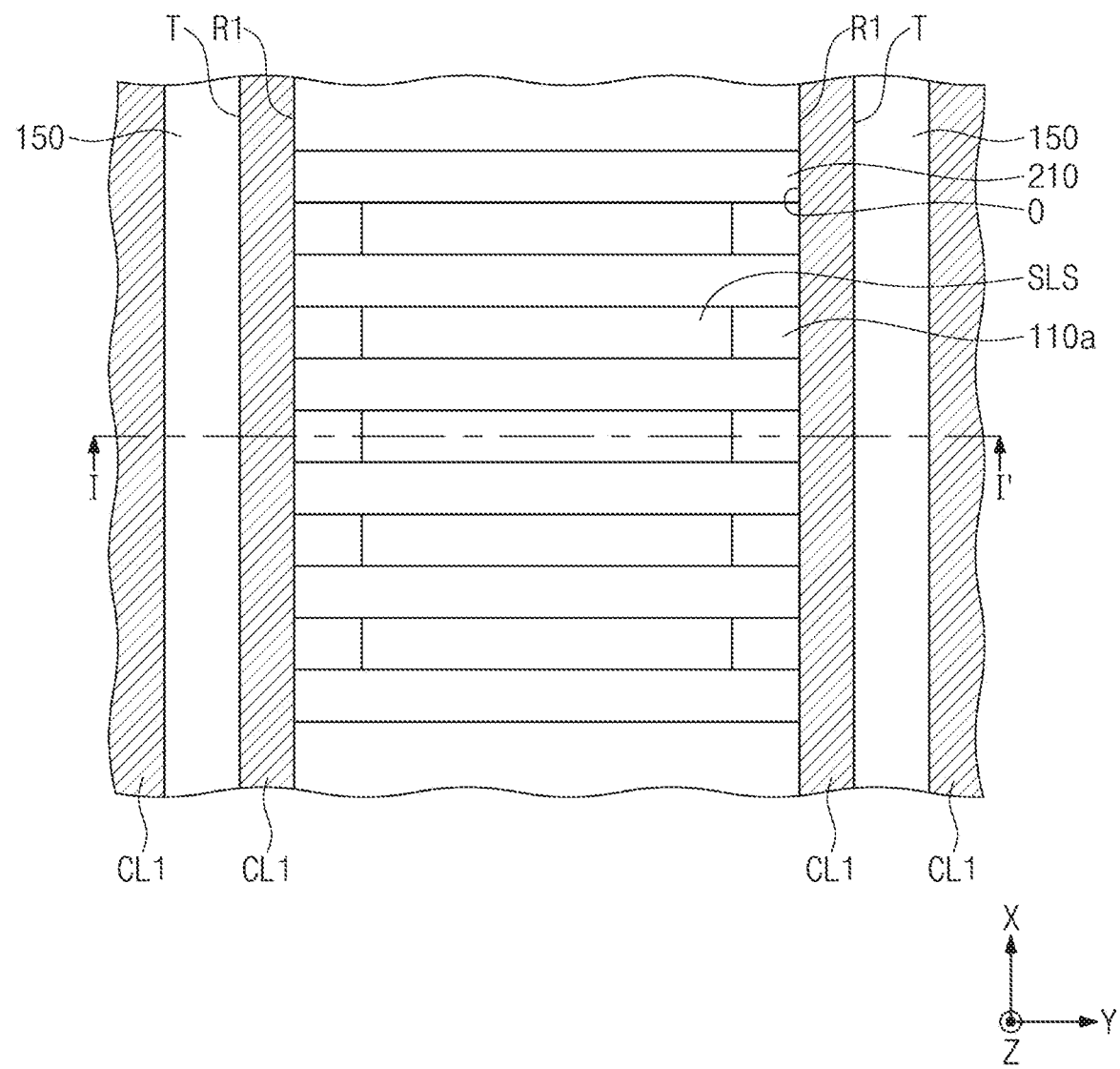
Figure 6B:
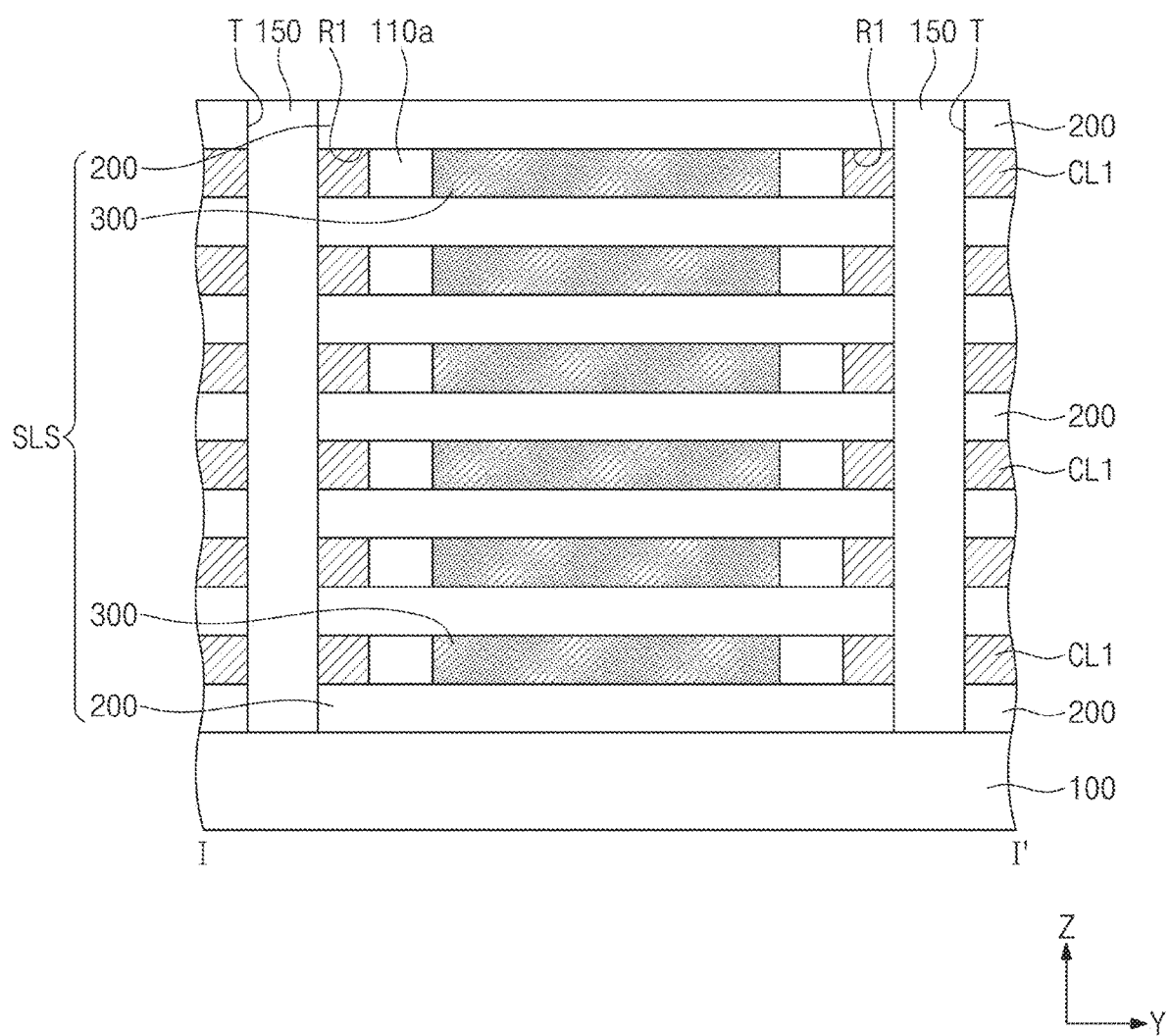

Referring to FIGS. 6A and 6B, portions of the sacrificial layers 300 exposed by the first recess regions R1 may be doped with dopants of a first conductivity type. Thus, first junction patterns 110a may be formed at both sides of each of the sacrificial layers 300. The dopants of the first conductivity type may be different from dopants of a second conductivity type. In some embodiments, the sacrificial layers 300 may include the dopants of the second conductivity type. Thus, the first junction patterns 110a may include the dopants of the first conductivity type and the dopants of the second conductivity type.

After the formation of the first junction patterns 110a, first conductive lines CL1 may be formed in the first recess regions R1. For example, a conductive layer may be formed to fill the first recess regions R1 and the trenches T, and then, the conductive layer in the trenches T may be removed until the top surface of the substrate 100 is exposed, thereby forming the first conductive lines CL1. The first conductive lines CL1 may be formed locally in the first recess regions R1. The first conductive lines CL1 may extend in the first direction X. The first conductive lines CL1 may be in contact with sidewalls of the first junction patterns 110a, the top and bottom surfaces of the insulating layers 200 exposed by the first recess regions R1, and the sidewalls of the filling insulation patterns 210.

Isolation insulating patterns 150 may be formed in the trenches T, respectively. For example, an insulating layer may be formed to fill the trenches T and to cover top surfaces of the layer structures SLS, and a planarization process may be performed on the insulating layer until the top surfaces of the layer structures SLS are exposed, thereby forming the isolation insulating patterns 150. Each of the isolation insulating patterns 150 may extend in the first direction X and may be disposed between the first conductive lines CL1 adjacent to each other in the second direction Y. For example, the isolation insulating patterns 150 may include an oxide, a nitride, and/or an oxynitride.

Figure 7A:
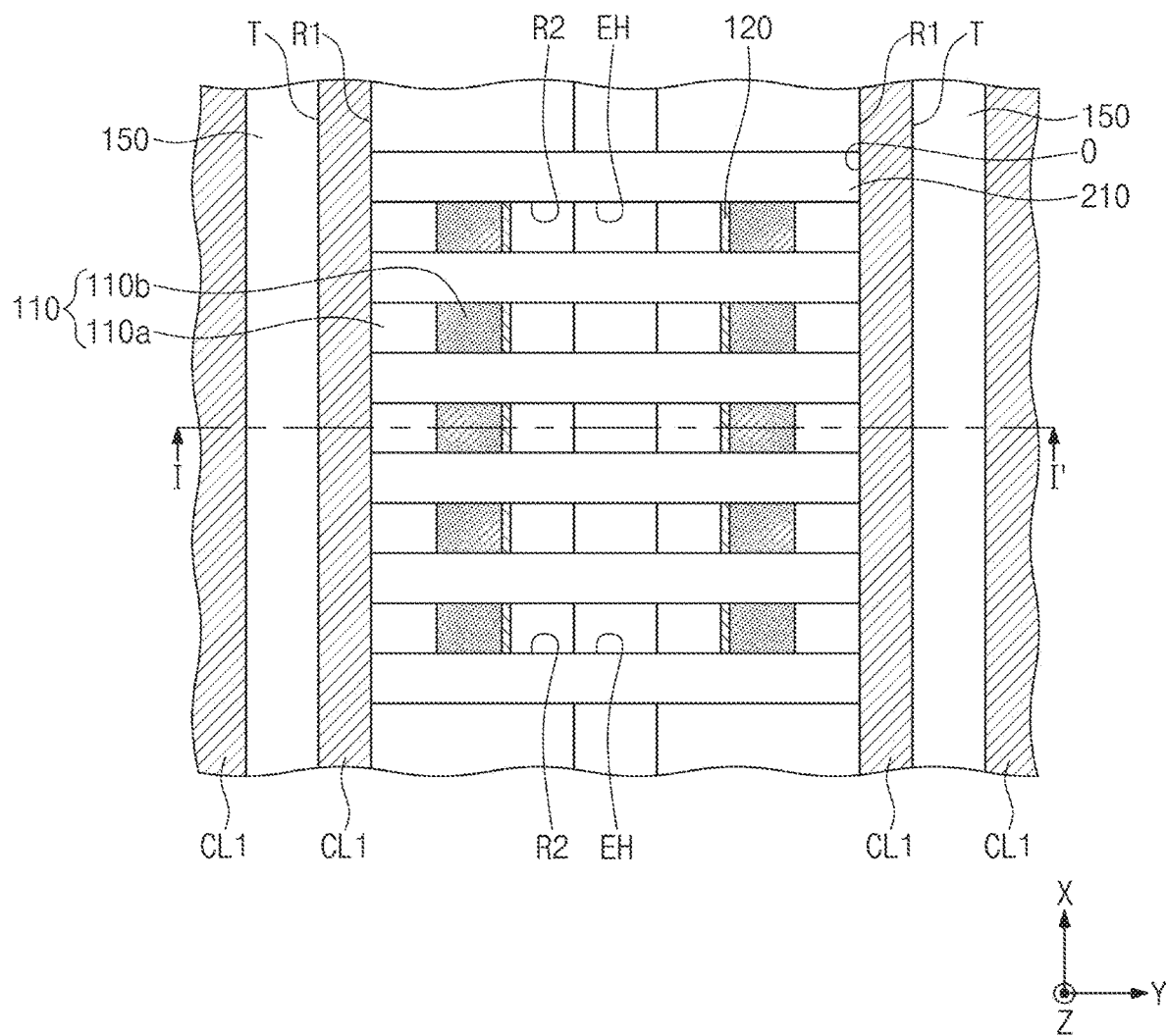
Figure 7B:
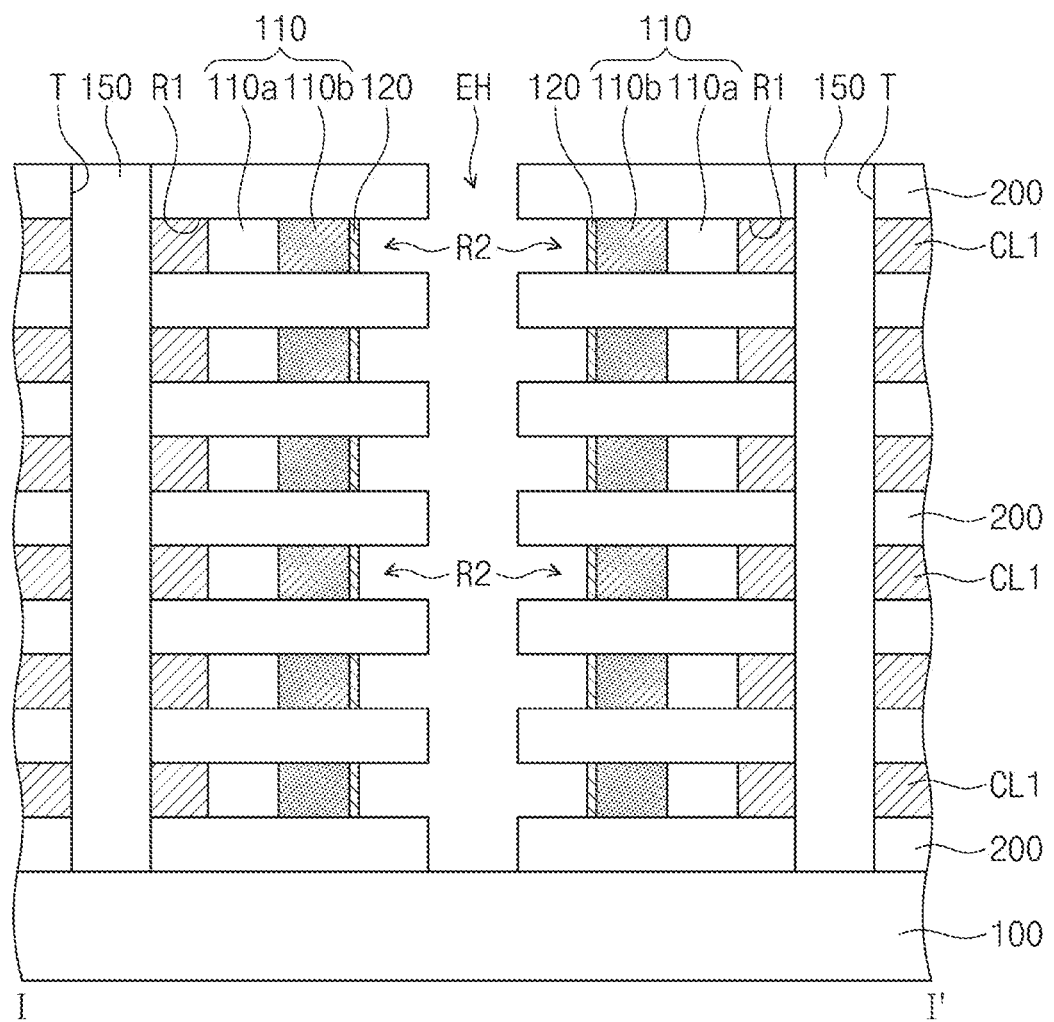

Referring to FIGS. 7A and 7B, electrode holes EH may be formed in the layer structures SLS. For example, a mask pattern (not shown) may be formed on the layer structures SLS and the filling insulation patterns 210, and the layer structures SLS may be etched using the mask pattern as an etch mask to form the electrode holes EH. For example, the etching process may be an anisotropic etching process. The electrode holes EH may be spaced apart from each other and be arranged in the first direction X. Each of the electrode holes EH may be disposed between the first conductive lines CL1 adjacent to each other in the second direction Y and may be formed between the first junction patterns 110a facing each other in the second direction Y. Each of the electrode holes EH may divide each of the layer structures SLS in the second direction Y. In other words, the electrode hole EH may divide a single layer structure SLS disposed between the filling insulation patterns 210 into two layer structures SLS spaced apart from each other in the second direction Y. The electrode hole EH may expose portions of sidewalls of the filling insulation patterns 210 adjacent to each other in the first direction X, sidewalls of the layer structures SLS spaced apart from each other in the second direction Y, and a portion of the top surface of the substrate 100.

Portions of the sacrificial layers 300 exposed by the electrode holes EH may be etched to form second recess regions R2. For example, the second recess regions R2 may be formed by etching portions of the sacrificial layers 300 of the layer structures SLS. Each of the second recess regions R2 may be formed between the insulating layers 200 adjacent to each other in the third direction Z. The portions of the sacrificial layers 300 may be etched, and thus sidewalls of the sacrificial layers 300 may be laterally recessed from sidewalls of the insulating layers 200. Widths of the sacrificial layers 300 in the second direction Y may be reduced by the formation of the second recess regions R2. The sidewalls of the sacrificial layers 300, portions of the top and bottom surfaces of the insulating layers 200, and portions of the sidewalls, parallel to the second direction Y, of the filling insulation patterns 210 may be exposed by the second recess regions R2.

Electrodes 120 may be respectively formed on the sidewalls of the sacrificial layers 300, which are exposed by the second recess regions R2. In some embodiments, the formation of the electrodes 120 may include forming a metal layer covering the sidewalls of the sacrificial layers 300 exposed by the second recess regions R2, performing a thermal treatment process to react the metal layer with the sidewalls of the sacrificial layers 300, and removing a remaining portion of the metal layer which does not react with the sidewalls of the sacrificial layers 300. In some cases, the electrodes 120 may include a metal silicide. Remaining portions of the sacrificial layers 300 which do not react with the metal layer may be referred to as second junction patterns 110b. The second junction patterns 110b may include the dopants of the second conductivity type. Each of the first junction patterns 110a and each of the second junction patterns 110b may constitute a switching pattern 110.

In certain embodiments, the formation of the electrodes 120 may include forming a metal layer filling the second recess regions R2 and portions of the electrode holes EH, removing the metal layer formed in the electrode holes EH, and etching the metal layer in the second recess regions R2 until the metal layer having a desired thickness remains in each of the second recess regions R2. In this case, the electrodes 120 may include a metal. The sacrificial layers 300 remaining between the insulating layers 200 may be referred to as the second junction patterns 110b.

Figure 8A:
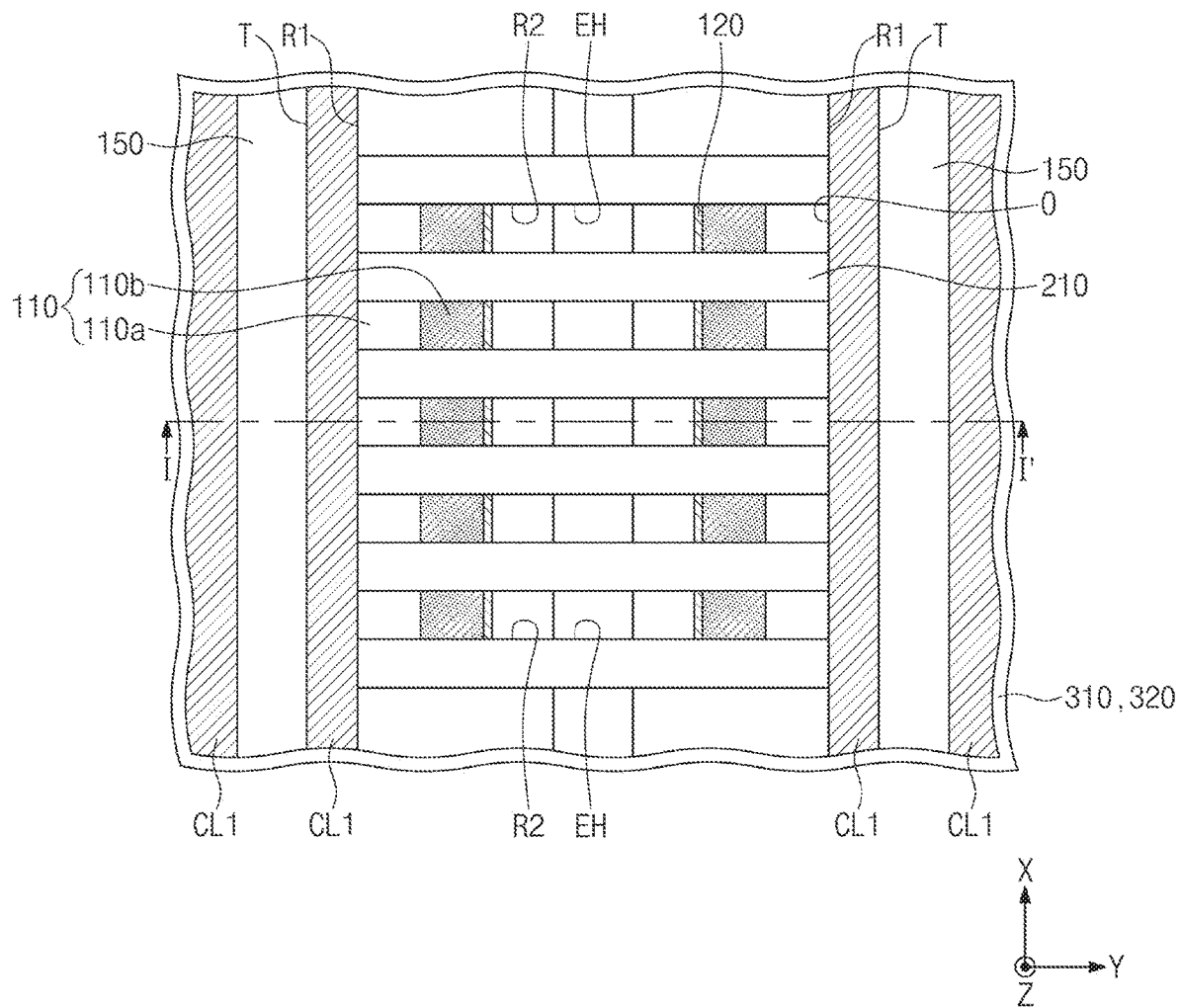
Figure 8B:
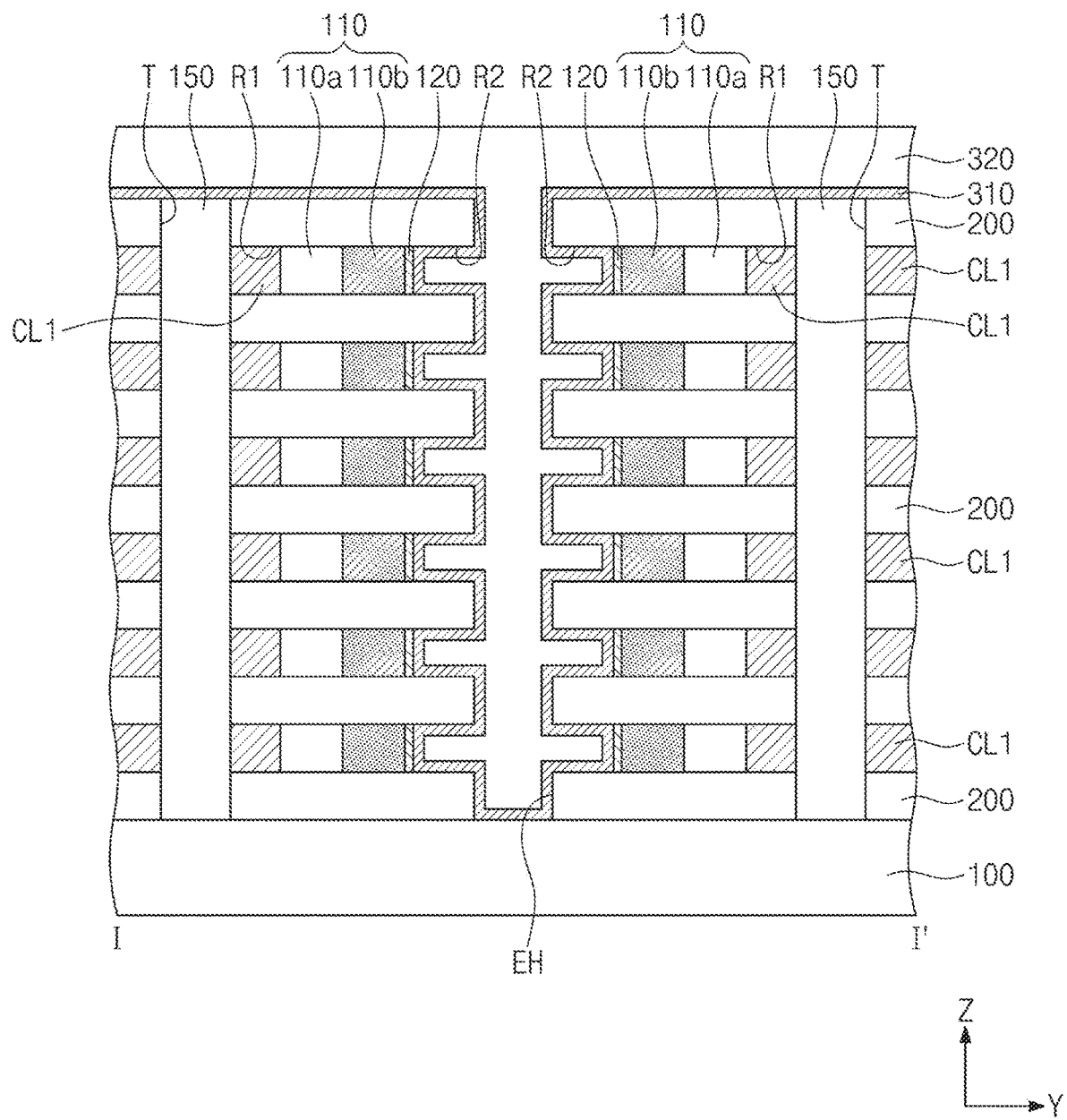

Referring to FIGS. 8A and 8B, a phase change layer 310 may be formed on the uppermost insulating layer 200. The phase change layer 310 may conformally cover a top surface of the uppermost insulating layer 200, the sidewalls of the insulating layers 200 and the filling insulation patterns 210 exposed by the electrode holes EH, the top and bottom surfaces of the insulating layers 200 exposed by the second recess regions R2, and sidewalls of the electrodes 120 exposed by the second recess regions R2. The phase change layer 310 may also cover the portions of the top surface of the substrate 100, which are exposed by the electrode holes EH.

In some embodiments, the phase change layer 310 may include a material capable of storing data based on a change in resistance. In some embodiments, the phase change layer 310 may include a material of which a phase is reversibly changeable between a crystalline state and an amorphous state by temperature and/or a cooling speed. For example, the phase change layer 310 may include a compound that includes at least one of Te or Se (e.g., chalcogen elements) and at least one of Ge, Sb, Bi, Pb, Sn, Ag, As, S, Si, In, Ti, Ga, P, O, or C. For example, the phase change layer 310 may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. The phase change layer 310 may further include impurities. For example, the impurities may include carbon (C), nitrogen (N), or silicon (Si).

In certain embodiments, the phase change layer 310 may include at least one of a perovskite compound or a conductive metal oxide. The phase change layer 310 may have a double-layer structure of a conductive metal oxide layer and a tunnel insulating layer or may have a triple-layer structure of a first conductive metal oxide layer, a tunnel insulating layer and a second conductive metal oxide layer. In this case, the tunnel insulating layer may include aluminum oxide, hafnium oxide, or silicon oxide.

For example, the phase change layer 310 may be formed by performing an atomic layer deposition (ALD) process. Referring to FIGS. 8A, 8B and 3B, the phase change layer 310 may be formed by repeating a deposition cycle a plurality of times. The deposition cycle may include forming a first material layer 132 by supplying a first reactant onto the substrate 100 to adsorb the first reactant onto surfaces of the insulating layers 200, the sidewalls of the filling insulation patterns 210, the portions of the top surface of the substrate 100, and the sidewalls of the electrodes 120, which are exposed by the electrode holes EH and the second recess regions R2; removing the first reactant not formed into the first material layer 132 by using an inert gas; forming a second material layer 134 by supplying a second reactant onto the substrate 100 to adsorb the second reactant onto a surface of the first material layer 132; and removing the second reactant not formed into the second material layer 134 by using an inert gas. For example, the first material layers 132 and the second material layers 134 may be alternately formed on the surfaces of the insulating layers 200, the sidewalls of the filling insulation patterns 210, the portions of the top surface of the substrate 100, and the sidewalls of the electrodes 120, which are exposed by the electrode holes EH and the second recess regions R2. In other words, the phase change layer 310 may include the first material layers 132 and the second material layers 134. The first material layers 132 and the second material layers 134 may include phase change materials. For example, the first material layers 132 may include GeTe, InTe, or GeTe, and the second material layers 134 may include $Sb_2Te_3$ or $Bi_2Te_3$.

The phase change layer 310 may have a thickness of about 10 Å to about 100 Å. A thermal treatment process may be performed after the formation of the phase change layer 310. A temperature of the thermal treatment process may range from about 250 degrees Celsius to about 350 degrees Celsius.

According to the embodiments of the inventive concepts, the phase change layer 310 may be formed using the ALD process, and thus a high-density phase change layer 310 may be formed. As a result, it is possible to prevent a void from being formed in phase change patterns 130 formed by patterning the phase change layer 310, and thus the reliability of the variable resistance memory device may be improved.

According to the embodiments of the inventive concepts, a volume of the phase change pattern 130 formed from the phase change layer 310 formed by the ALD process may be less than a total volume of the second recess region R2. In other words, the phase change pattern 310 may partially fill the second recess region R2. Since a reset current decreases as the volumes of the phase change patterns 130 decrease, power consumption of the variable resistance memory device may be reduced.

A capping layer 320 may be formed on the phase change layer 310. The capping layer 320 may cover a top surface of the phase change layer 310 and may fill the second recess regions R2 and the electrode holes EH, which have the phase change layer 310. For example, the capping layer 320 may be formed by performing an ALD process. A deposition source used in the deposition process may include a material which can be deposited at low temperature and has low reactivity with the phase change layer 310. For example, the deposition source may include $SiH_4$, $SiH_2I_2$, or $SiL_4$. A process temperature of the capping layer 320 may range from about 100 degrees Celsius to about 300 degrees Celsius. An additional thermal treatment process may be performed after the deposition of the capping layer 320. The additional thermal treatment process may be performed at a temperature of about 200 degrees Celsius to about 400 degrees Celsius.

Figure 9A:
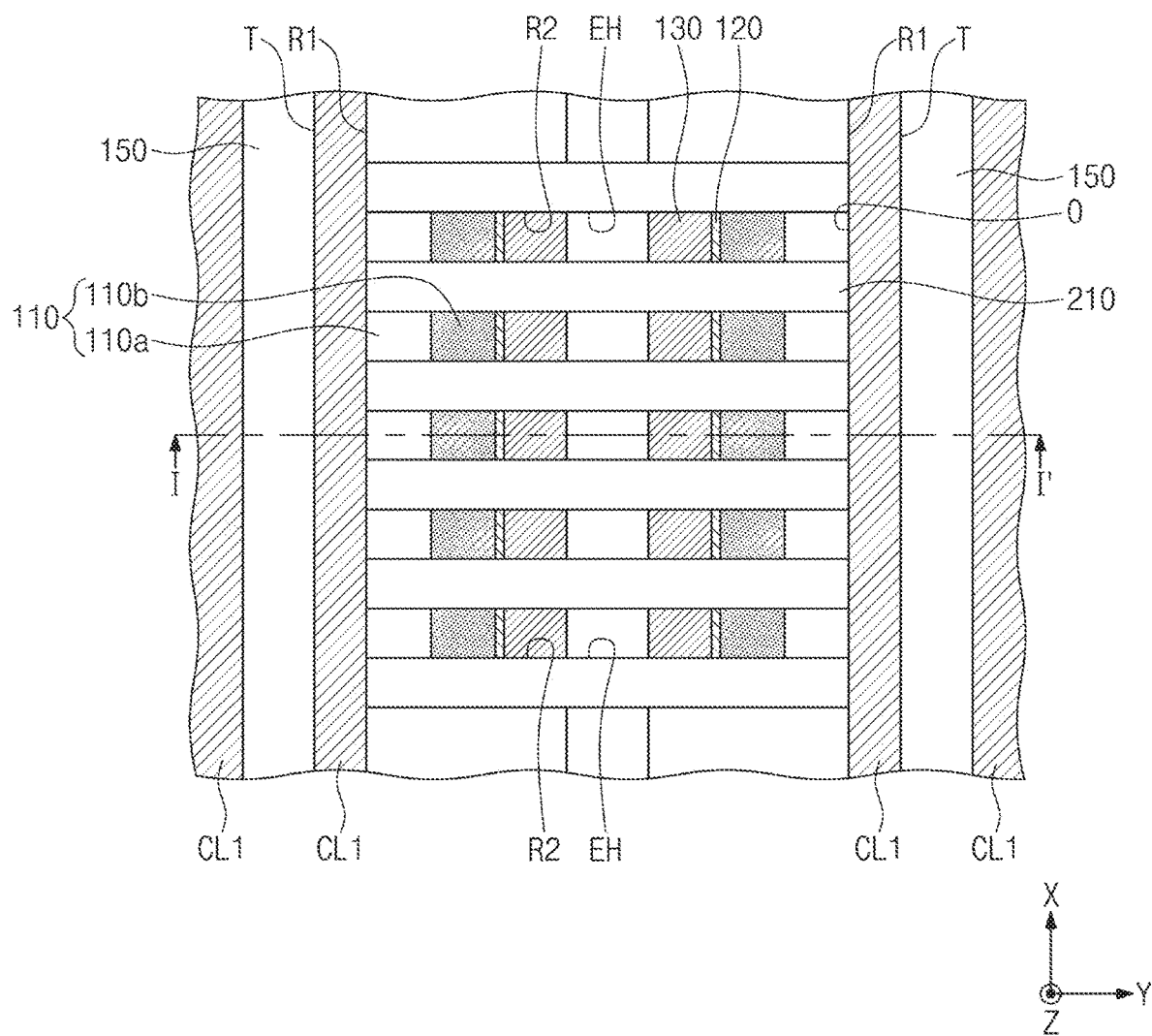
Figure 9B:
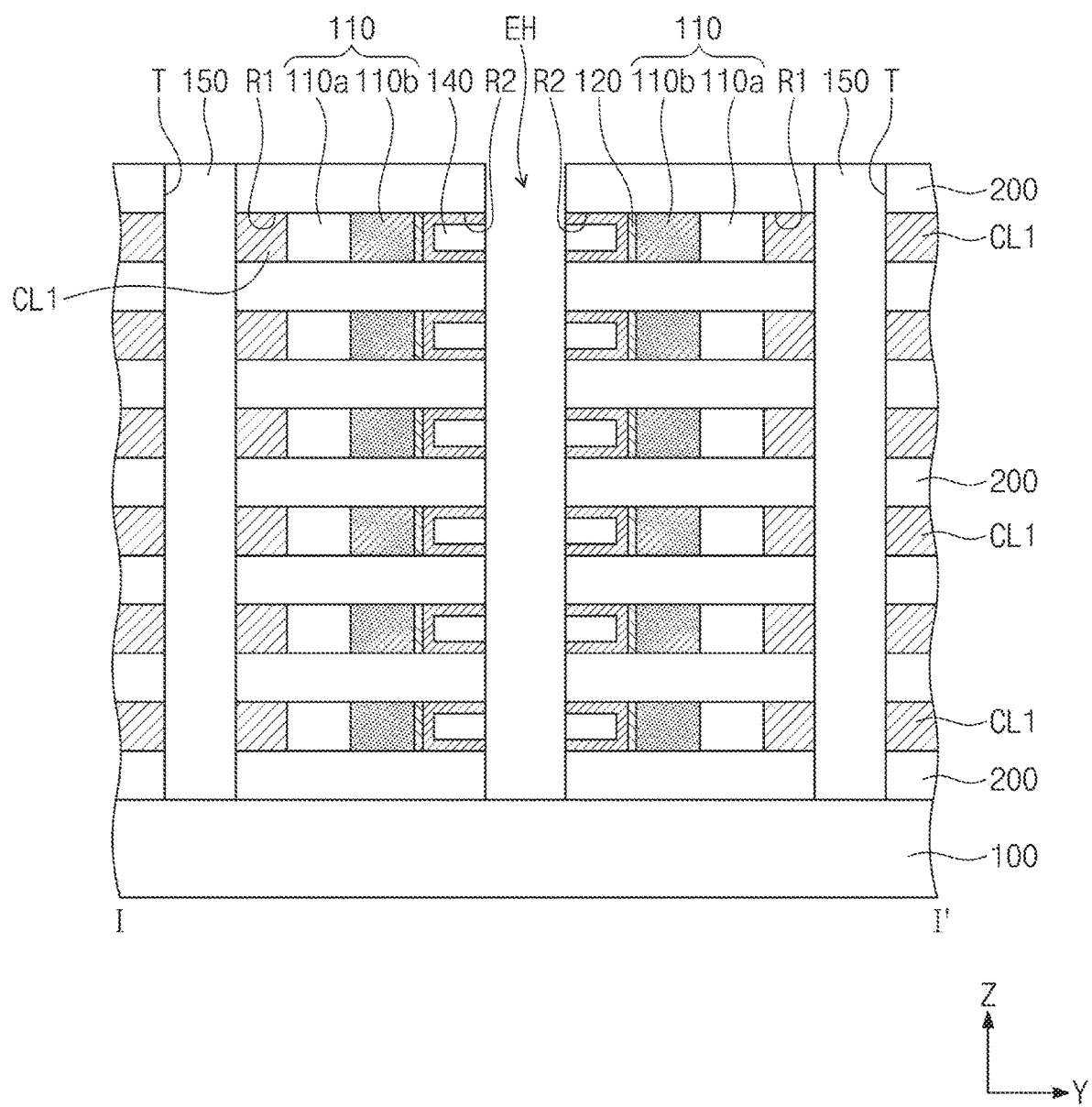

Referring to FIGS. 9A and 9B, the phase change layer 310 and the capping layer 320 which are formed in the electrode holes EH may be removed to form phase change patterns 130 and capping patterns 140 in the second recess regions R2. The phase change patterns 130 and the capping patterns 140 may be formed locally in the second recess regions R2. For example, the phase change patterns 130 may conformally cover the sidewalls of the filling insulation patterns 210, the sidewalls of the electrodes 120 facing the electrode holes EH, and the top and bottom surfaces of the insulating layers 200, which are exposed by the second recess regions R2. The capping patterns 140 may fill the second recess regions R2 having the phase change patterns 130. Sidewalls of the capping patterns 140, sidewalls of the filling insulation patterns 210, and sidewalls of the phase change patterns 130 may be exposed through the electrode holes EH by the removal process. The removal process may be an isotropic etching process. For example, the removal process may use an etching gas including H, Br, I, or F. The removal process may be performed using a pulse having a frequency of about 1 MHz to about 5 GHz.

A surface treatment process may be performed on sidewalls of the electrode holes EH after the formation of the phase change patterns 130 and the capping patterns 140. The sidewalls of the electrode holes EH may become uniformly flat by the surface treatment process. The surface treatment process may use, for example, hydrofluoric acid (HF).

Referring again to FIGS. 1 and 2, second conductive lines CL2 may be formed in the electrode holes EH, respectively. The formation of the second conductive lines CL2 may include forming metal barrier patterns 223 and forming metal patterns 221. The metal barrier patterns 223 may be formed using a low-temperature deposition process. The metal barrier patterns 223 may conformally cover the sidewalls of the filling insulation patterns 210, the sidewalls of the phase change patterns 130, and the sidewalls of the capping patterns 140, which are exposed by the electrode holes EH. The deposition process of the metal barrier patterns 223 may be performed at a temperature of about 200 degrees Celsius to about 400 degrees Celsius. Since the metal barrier patterns 223 are formed at the low temperature, volatilization of the phase change patterns 130 may be prevented. The metal barrier patterns 223 may be used as barrier layers between the phase change patterns 130 and the metal patterns 221 and seed layers for forming the metal patterns 221.

The metal patterns 221 may be formed in spaces surrounded by the metal barrier patterns 223 in the electrode holes EH. The metal patterns 221 may fill the electrode holes EH.

According to the embodiments of the inventive concepts, the high-density phase change layer may be formed by performing the ALD process. As a result, it is possible to prevent a void from being formed in the phase change patterns formed by patterning the phase change layer, and thus the reliability of the variable resistance memory device may be improved.

According to the embodiments of the inventive concepts, the volumes of the phase change patterns formed using the ALD process may be reduced. Since the reset current decreases as the volumes of the phase change patterns decrease, the power consumption of the variable resistance memory device may be reduced.

While the inventive concepts have been described with reference to example embodiments, it will be apparent to those skilled in the art that various changes and modifications may be made without departing from the scope of the present disclosure. Therefore, it should be understood that the above embodiments are not limiting, but illustrative. Thus, the scope of the present disclosure is to be determined by the broadest permissible interpretation of the following claims and their equivalents, and shall not be restricted or limited by the foregoing description.

What is claimed is:

1. A variable resistance memory device comprising:
    a plurality of insulating layers stacked on a substrate;
    a first conductive line penetrating the plurality of insulating layers;
    a plurality of switching patterns, each switching pattern between a respective pair of adjacent insulating layers of the plurality of insulating layers;
    a phase change pattern between the first conductive line and each of the switching patterns; and
    a capping pattern between the phase change pattern and the first conductive line and at least partially surrounded by the phase change pattern.

2. The variable resistance memory device of claim 1, wherein the phase change pattern and the capping pattern are in contact with the first conductive line.

3. The variable resistance memory device of claim 1, wherein the phase change pattern comprises: first material layers and second material layers, which are alternately stacked on a sidewall of each of the switching patterns.

4. The variable resistance memory device of claim 1, wherein the first conductive line is in contact with the substrate.

5. The variable resistance memory device of claim 1, wherein at least one of the insulating layers is in contact with the substrate.

6. The variable resistance memory device of claim 1, further comprising:
    a first filling insulation pattern and a second filling insulation pattern, which are spaced apart from each other with the first conductive line interposed therebetween when viewed in a plan view,
    wherein the phase change pattern comprises:
    a first horizontal portion contacting a bottom surface of an upper one of a first insulating layer of the plurality of insulating layers;
    a second horizontal portion contacting a top surface of a lower one of a second insulating layer of the plurality of insulating layers that is vertically adjacent to the first insulating layer;
    a first vertical portion on a sidewall of a switching pattern of the plurality of switching patterns and connecting the first horizontal portion and the second horizontal portion;

a second vertical portion extending from the second horizontal portion onto a sidewall of the first filling insulation pattern; and a third vertical portion extending from the second horizontal portion onto a sidewall of the second filling insulation pattern, which is opposite to the sidewall of the first filling insulation pattern.

7. The variable resistance memory device of claim 1, further comprising:

an electrode between the phase change pattern and each of the switching patterns;

an isolation insulating pattern disposed on a top surface of the substrate at both sides of the insulating layers; and a second conductive line between the isolation insulating pattern and each of the switching patterns.

8. The variable resistance memory device of claim 1, wherein each of the switching patterns is a diode.

9. A variable resistance memory device comprising:

a plurality of insulating layers stacked on a substrate;

a first conductive line penetrating the plurality of insulating layers;

a plurality of switching patterns, each switching pattern between a respective pair of adjacent insulating layers of the plurality of insulating layers; and a phase change pattern between the first conductive line and each of the switching patterns, wherein the phase change pattern comprises: a plurality of first material layers and a plurality of second material layers, which are alternately stacked on a sidewall of each of the switching patterns.

10. The variable resistance memory device of claim 9, wherein the plurality of first material layers each include GeTe, InTe, or GeTe, and wherein the plurality of second material layers each include $Sb_2Te_3$ or $Bi_2Te_3$.

11. The variable resistance memory device of claim 9, wherein the phase change pattern comprises:

a vertical portion on the sidewall of each of the switching patterns;

a first horizontal portion extending toward the first conductive line and contacting a bottom surface of an upper one of a first insulating layer; and a second horizontal portion extending toward the first conductive line and contacting a top surface of a lower one of a second insulating layer, wherein the first insulating layer is vertically adjacent to the second insulating layer, and wherein the second horizontal portion is parallel to the first horizontal portion.

12. The variable resistance memory device of claim 11, further comprising:

a capping pattern between the phase change pattern and the first conductive line, wherein the capping pattern is at least partially surrounded by the phase change pattern, and wherein the phase change pattern is in contact with the first conductive line.

13. The variable resistance memory device of claim 9, further comprising:

a capping pattern between the phase change pattern and the first conductive line, wherein the capping pattern is in contact with the first conductive line.

14. The variable resistance memory device of claim 9, wherein the first conductive line comprises:

a metal pattern penetrating the insulating layers; and a metal barrier pattern surrounding the metal pattern.

15. The variable resistance memory device of claim 9, further comprising:

a plurality of second conductive lines on both sides of the first conductive line and between the insulating layers, wherein each of the switching patterns is between the phase change pattern and one of the plurality of second conductive lines.

16. A variable resistance memory device comprising:

a plurality of first conductive lines which are parallel to each other on a substrate and are spaced apart from each other;

a second conductive line which extends perpendicular to a top surface of the substrate and is between the first conductive lines; and a phase change pattern between each of the first conductive lines and the second conductive line, wherein a sidewall of the phase change pattern that is adjacent to the second conductive line has a region that is recessed from contact with the second conductive line.

17. The variable resistance memory device of claim 16, further comprising:

a capping pattern in the region, wherein the capping pattern is in contact with the second conductive line.

18. The variable resistance memory device of claim 17, wherein the capping pattern includes an insulating material.

19. The variable resistance memory device of claim 16, wherein the first conductive lines are spaced apart from each other in a first direction, further comprising:

filling insulation patterns which are spaced apart from each other in a second direction perpendicular to the first direction with the second conductive line interposed therebetween and have long axes in the first direction.

20. The variable resistance memory device of claim 16, further comprising a plurality of second conductive lines, wherein the second conductive lines are spaced apart from each other, and wherein the phase change pattern is provided in plurality, and the phase change patterns are disposed between each of the first conductive lines and the second conductive lines and are spaced apart from each other.

* * * * *